(12) United States Patent
Otsubo et al.

(10) Patent No.: US 11,476,172 B2
(45) Date of Patent: Oct. 18, 2022

(54) RADIO FREQUENCY MODULE

(71) Applicant: Murata Manufacturing Co., Ltd., Kyoto (JP)

(72) Inventors: Yoshihito Otsubo, Kyoto (JP); Yuta Morimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 107 days.

(21) Appl. No.: 16/985,411

(22) Filed: Aug. 5, 2020

(65) Prior Publication Data

US 2020/0365476 A1 Nov. 19, 2020

Related U.S. Application Data

(63) Continuation of application No. PCT/JP2019/003966, filed on Feb. 5, 2019.

(30) Foreign Application Priority Data

Feb. 8, 2018 (JP) .............................. JP2018-020691

(51) Int. Cl.
*H01L 23/14* (2006.01)
*H01Q 1/52* (2006.01)
*H01Q 23/00* (2006.01)

(52) U.S. Cl.
CPC .......... *H01L 23/142* (2013.01); *H01Q 1/526* (2013.01); *H01Q 23/00* (2013.01);
(Continued)

(58) Field of Classification Search
CPC .................................................. H01L 23/142
See application file for complete search history.

(56) References Cited

U.S. PATENT DOCUMENTS 3,012,868 A1 9/2011 Naval et al.
2005/0040501 A1 2/2005 Hagen
(Continued)

FOREIGN PATENT DOCUMENTS

EP 2752872 A1 7/2014
JP 2001-044305 A 2/2001
(Continued)

OTHER PUBLICATIONS

International Search Report in Application No. PCT/JP2019/003966, dated Apr. 16, 2019.
(Continued)

*Primary Examiner* — William A Harriston
(74) *Attorney, Agent, or Firm* — Pearne & Gordon LLP

(57) ABSTRACT

A radio frequency module in which the loop shape of a wire can be stable by disposing a protruding electrode at a bonding ending-point portion when a bonding wire forms a shield between components is provided. A radio frequency module includes a multilayer wiring board, components to mounted on an upper surface of the multilayer wiring board, a shield member formed of a plurality of bonding wires to cover the component, and a protruding electrode provided at a bonding ending-point portion of each of the bonding wires. Since the protruding electrode is provided at the bonding ending-point portion of each of the bonding wires, undesired bending can be prevented on a second bond side of the bonding wire. The shield member to cover side surfaces and a top surface of the component can be easily formed.

20 Claims, 6 Drawing Sheets

(52) U.S. Cl.
CPC .............. *H01L 2224/16225* (2013.01); *H01L 2224/48227* (2013.01); *H01L 2924/181* (2013.01); *H01L 2924/19105* (2013.01); *H01L 2924/19107* (2013.01)

(56) References Cited

U.S. PATENT DOCUMENTS

| | | |
|---|---|---|
| 2005/0269701 A1 | 12/2005 | Tsuji et al. |
| 2012/0061816 A1 | 3/2012 | Song et al. |
| 2017/0236785 A1 | 8/2017 | Chen |
| 2017/0263568 A1 | 9/2017 | Jeon et al. |
| 2017/0317002 A1 | 11/2017 | Kitahara et al. |
| 2019/0181098 A1* | 6/2019 | Lee .................... H01L 25/0655 |

FOREIGN PATENT DOCUMENTS

| | | |
|---|---|---|
| JP | 2005-050868 A | 2/2005 |
| JP | 2005-347489 A | 12/2005 |
| JP | 5276169 B2 | 8/2013 |
| WO | 2016/117196 A1 | 7/2016 |

OTHER PUBLICATIONS

Written Opinion issued in Application No. PCT/JP2019/003966, dated Apr. 16, 2019.

\* cited by examiner

RADIO FREQUENCY MODULE

This is a continuation of International Application No. PCT/JP2019/003966 filed on Feb. 5, 2019, which claims priority from Japanese Patent Application No. 2018-020691 filed on Feb. 8, 2018. The contents of these applications are incorporated herein by reference in their entireties.

BACKGROUND

Technical Field

The present disclosure relates to a radio frequency module including a shield.

A motherboard of an electronic device, such as a communication terminal device has mounted thereon various radio frequency modules. Such radio frequency modules include a radio frequency module in which a component mounted on a wiring board is sealed with a sealing resin layer. Moreover, the surface of the sealing resin layer may be covered with a shield film to shield the component from noise. When a plurality of components are mounted on a wiring board, only a specific component may be desired to be shielded from noise. However, it is difficult to shield only the specific component from noise using the shield film that covers the surface of the sealing resin layer. The degree of freedom in design is low. Hence, a radio frequency module in which a shield member having a high degree of freedom in design can be disposed is suggested. For example, as illustrated in FIG. 11, a component 102 is mounted on a wiring board 101 in a radio frequency module 100 described in Patent Document 1. The component 102 is surrounded by a plurality of bonding wires 103. The bonding wires 103 shield the component 102. With this configuration, the bonding wires 103 are mounted only at portions required to be shielded, and hence the degree of freedom in design for the shield member is increased.

Patent Document 1: Japanese Patent No. 5276169 (see paragraphs 0021 to 0024, FIG. 3, etc.)

BRIEF SUMMARY

In the radio frequency module 100 of the related art, loops of the bonding wires 103 are arranged at a predetermined interval to constitute a shield structure. The bonding wires 103 are, however, easily deformed. Due to this, to form a shield member having a shape that extends over the component 102, the distance between the component 102 and the bonding wire 103 or in particular an end portion of the bonding wire 103 on a second bond side that is a wire ending-point side needs to be large enough. This is because, in a wire bonding technology, it is relatively easy to control the loop shape on a first bond side that is a wire starting-point side; however, it is relatively difficult to control the loop shape on the second bond side. The reason why controlling the loop shape on the second bond side is difficult is because it is difficult to bend the wire and dispose the wire at a position close to the component and the loop shape of the wire is required to be an extended end shape on the second bond side, and hence the wire ending point has to be set at a position far from the component. Thus, it has been difficult to form the bonding wire 103 to straddle the component 102 so as not to come into contact with the component 102 without necessarily providing a large distance between the component 102 and the wire.

The present disclosure provides a radio frequency module that has a high degree of freedom in design for a shield, that has shield characteristics less variable, and in which components can be mounted with high density.

A radio frequency module according to the present disclosure includes a wiring board; a component mounted on one principal surface of the wiring board; a first protruding electrode formed on the one principal surface of the wiring board; and a shield member that is formed of a bonding wire and that shields the component. The bonding wire has a bonding starting-point portion connected to the one principal surface of the wiring board and a bonding ending-point portion connected to the first protruding electrode.

With this configuration, since the bonding ending-point portion of the bonding wire is connected to the protruding electrode, the loop shape on a second bond side can be controlled. A shield member can be formed without necessarily a contact with the component. Moreover, since the protruding electrode is provided particularly at the bonding ending-point portion at which it is difficult to have a small distance, the extended end portion of the wire can be eliminated or reduced. The distance between the component and the ending-point portion of the bonding wire can be decreased. Thus, components can be mounted with high density, and the degree of freedom in design can be increased. Moreover, when a component is mounted by wire bonding, a shield member can be formed simultaneously in the same step as the step of mounting the component.

The first protruding electrode may be formed by metal plating.

Alternatively, the first protruding electrode may be formed of a metal block.

The radio frequency module may further include a second protruding electrode formed on the one principal surface of the wiring board, and the starting-point portion may be connected to the second protruding electrode.

With this configuration, since the bonding wire can be bonded to the corresponding protruding electrode, the loop shape of the bonding wire can be easily controlled. The shield member can be formed without necessarily the bonding wire coming into contact with a side surface of the component while the distance between the component and the bonding wire is decreased.

The second protruding electrode may be formed by metal plating.

Alternatively, the second protruding electrode may be formed of a metal block.

The radio frequency module may further include a sealing resin layer that seals the component; and a shield film provided on a surface of the sealing resin layer. The sealing resin layer may have a contact surface that is in contact with the one principal surface of the wiring board, an opposite surface that is opposite to the contact surface, and side surfaces that couple end edges of the contact surface with end edges of the opposite surface. The shield film may cover at least the opposite surface and the side surfaces of the sealing resin layer. The bonding wire may be in contact with the shield film at the opposite surface of the sealing resin layer.

With this configuration, since the bonding wire is connected with the shield film, shield performance as a compartment shield can be increased.

The shield member may be formed of a plurality of the bonding wires, and the plurality of bonding wires may be each disposed to straddle the component. With this configuration, the shield member having a shape that covers the component can be easily formed.

The shield member may be formed of a plurality of the bonding wires, and the plurality of bonding wires may be disposed to extend along a periphery of the component to surround the component.

With this configuration, since the shield member is disposed along the periphery of the component, shield performance can be increased.

Some bonding wires of the plurality of bonding wires may be disposed in substantially parallel to one another when viewed in a direction perpendicular to the one principal surface of the wiring board, and residual bonding wires of the plurality of bonding wires may be disposed in substantially parallel to one another to intersect with the some bonding wires.

With this configuration, a shield member that covers the side surfaces and the top surface of a component can be easily formed.

The component may have a rectangular shape when viewed in a direction perpendicular to the one principal surface of the wiring board, and the plurality of bonding wires may be disposed in substantially parallel to one another in a direction oblique to a side of the component.

With this configuration, a component can be shielded from electromagnetic waves in any direction by less bonding wires.

Alternatively, a radio frequency module may include a wiring board; a component mounted on one principal surface of the wiring board; a plurality of first bumps electrode formed on the one principal surface of the wiring board; a shield member that is formed of a plurality of bonding wires and that shields the component; a sealing resin layer that seals the component; and a shield film provided on a surface of the sealing resin layer. The sealing resin layer may have a contact surface that is in contact with the one principal surface of the wiring board, an opposite surface that is opposite to the contact surface, and side surfaces that couple end edges of the contact surface with end edges of the opposite surface. The shield film may cover at least the opposite surface and the side surfaces of the sealing resin layer. The bonding wires may each have one end that is connected to the first protruding electrode and another end that is exposed from the opposite surface of the sealing resin layer and that is connected to the shield film.

With this configuration, since the bonding wire is connected with the shield film, shield performance as a compartment shield can be further increased.

With the present disclosure, since the bonding ending-point portion of the bonding wire is connected to the protruding electrode, the loop shape on the second bond side can be controlled. A shield member can be formed without necessarily a contact with the component. Moreover, since the distance between the bonding wire and the component can be decreased by controlling the loop shape using the protruding electrode, components can be mounted with high density, and the degree of freedom in design can be increased.

DETAILED DESCRIPTION

First Embodiment

Figure 1:
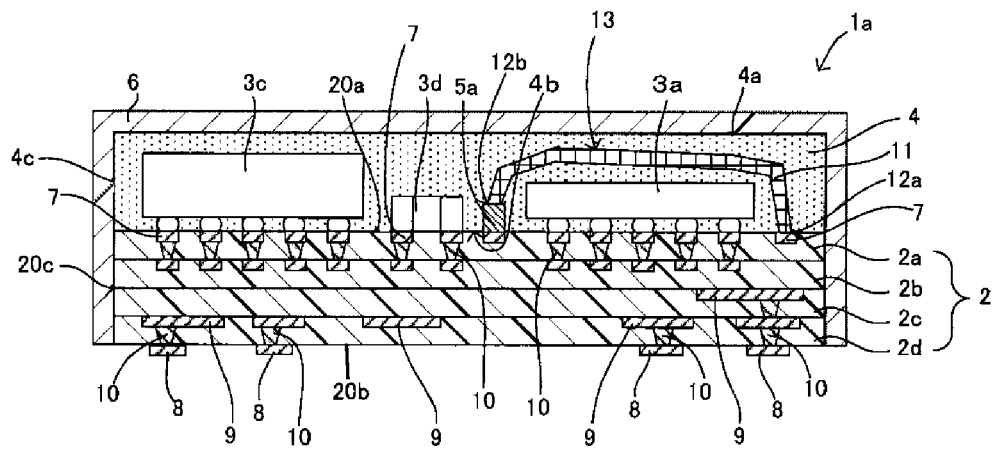
FIG. 1 is a cross-sectional view of a radio frequency module according to a first embodiment of the present disclosure.
Figure 2:
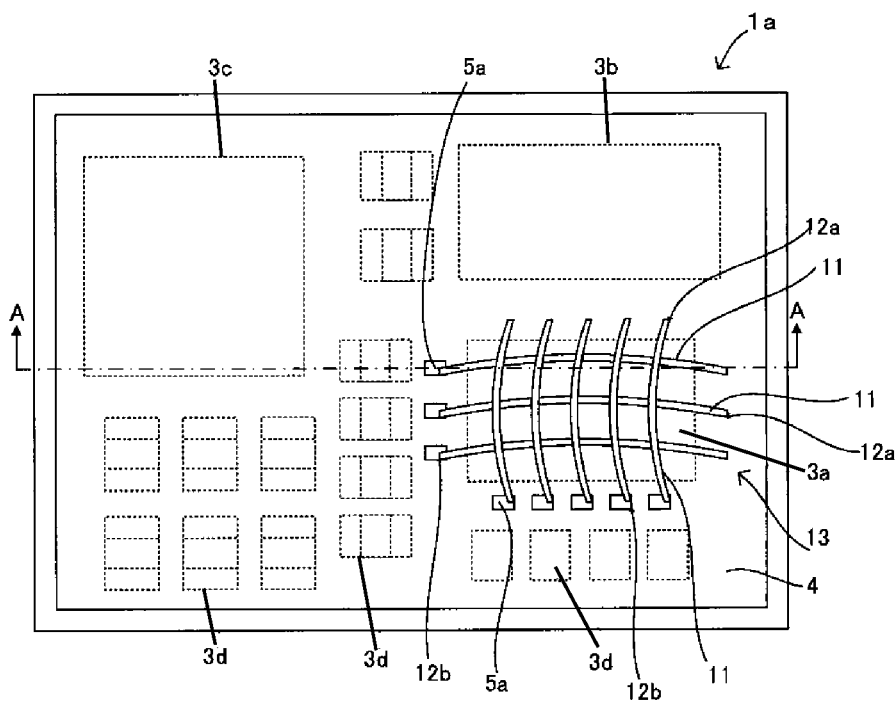
FIG. 2 is a plan view of the radio frequency module in FIG. 1 in a state without a shield film.

A radio frequency module 1a according to a first embodiment of the present disclosure is described with reference to FIGS. 1 and 2. FIG. 1 is a cross-sectional view taken along line A-A in FIG. 2. FIG. 2 is a plan view of the radio frequency module 1a in a state without necessarily a shield film 6.

As illustrated in FIGS. 1 and 2, the radio frequency module 1a according to this embodiment includes a multilayer wiring board 2 (corresponding to "a wiring board" according to the present disclosure), a plurality of components 3a to 3d mounted on an upper surface 20a of the multilayer wiring board 2, a sealing resin layer 4 stacked on the upper surface 20a of the multilayer wiring board 2, a shield film 6 that covers a surface of the sealing resin layer 4, a plurality of first protruding electrodes 5a mounted on the upper surface 20a of the multilayer wiring board 2, and a bonding wire 11 disposed to straddle the component 3a. For example, the radio frequency module 1a is mounted on a motherboard or the like of an electronic device that uses a radio frequency signal.

The multilayer wiring board 2 includes a plurality of stacked insulating layers 2a to 2d formed of, for example, low-temperature co-fired ceramics, high-temperature co-fired ceramics, or glass epoxy resin. Mount electrodes 7 of the components 3a to 3d are formed on or in the upper surface 20a of the multilayer wiring board 2 (corresponding to "one principal surface of the wiring board" according to the present disclosure). A plurality of outer electrodes 8 for outer connection are formed on or in a lower surface 20b of the multilayer wiring board 2. Various types of inner wiring electrodes 9 are formed between adjacent layers of the insulating layers 2a to 2d. A plurality of via conductors 10 are formed in the multilayer wiring board 2. The via conductors 10 connect the inner wiring electrodes 9 formed in the insulating layers 2a to 2d with one another. The mount electrode 7, the outer electrodes 8, and the inner wiring electrodes 9 are formed of a metal which is typically employed for wiring electrodes. Examples of the metal include copper, silver, and aluminum. Each via conductor 10 is formed of a metal, such as silver or copper. Each mount electrode 7 and each outer electrode 8 may be plated with nickel and gold.

The components 3a to 3d, each is a semiconductor element, such as an integrated circuit (IC) or a power amplifier (PA); or a chip component, such as a chip inductor, a chip capacitor, or a chip resistance. The components 3a to 3d are mounted on the multilayer wiring board 2 by a typical surface mount technology, such as solder bonding.

The sealing resin layer 4 is formed of resin which is typically employed for sealing resin, such as epoxy resin, and seals the components 3a to 3d. The sealing resin layer 4 has a lower surface 4b (corresponding to "a contact surface of a sealing resin layer" according to the present disclosure) that is in contact with the multilayer wiring board 2, an upper surface 4a (corresponding to "an opposite surface of the sealing resin layer" according to the present disclosure) opposite to the lower surface 4b, and side surfaces 4c.

Each first protruding electrode 5a is formed of a metal member or the like having a gold-plated surface.

A method of forming the first protruding electrode 5a includes, for example, when the multilayer wiring board 2 is a ceramic board, pressure bonding a resin sheet having a through hole filled with conductive paste onto an upper surface of a ceramic multilayer body (the multilayer wiring board 2 before firing), firing the ceramic multilayer body to burn and eliminate the resin sheet, sintering the conductive paste to form a metal bump on the upper surface 20a of the multilayer wiring board 2, and plating the metal bump with gold. Thus, the first protruding electrode 5a can be formed. Alternatively, a gold-plated metal block may be disposed, or a metal block may be disposed and then plated with gold. The metal block may be a metal pin. Still alternatively, a metal bump formed on a wiring board by plating may be used. This case is desirable because the metal bump can be disposed with high positioning accuracy in a minimum area. Moreover, since solder or the like is not used, solder flash or the like does not occur.

When the multilayer wiring board 2 is a resin substrate, such as a glass epoxy substrate, each first protruding electrode 5a can be formed as follows. First, a plate-shaped electrode base body formed of a metal material, such as copper is disposed on the upper surface 20a of the multilayer wiring board 2, and a feeding film is formed by electroless plating to cover the electrode base body. The feeding film is formed by electroless copper plating. Then, a plated resist film is applied to cover the feeding film. The plated resist film can be properly selected from known photoresist film materials. Then, the plated resist film is exposed to light and developed to form an opening to expose at least a portion of the feeding film, and electrolytic plating is applied to the opening to form a metal bump on the upper surface 20a of the multilayer wiring board 2. The metal bump is formed by, for example, copper plating. Then, the plated resist film is removed, the exposed feeding film and the electrode base body are removed by etching, and then a nickel-plated film and a gold-plated film are formed on the metal bump. Thus, the first protruding electrode 5a can be formed.

The surface of the first protruding electrode 5a is required to be plated with gold. However, as described above, the plated film may include two layers of a nickel-plated film and a gold-plated film, or may include one layer of a gold-plated film. Alternatively, the first protruding electrode 5a may be formed by disposing a metal block having a gold-plated surface on the upper surface 20a of the multi-layer wiring board 2. Alternatively, a component having a gold-plated terminal electrode may be used as the first protruding electrode 5a.

The bonding wire 11 is a metal wire of, for example, gold, aluminum, or copper, which is typically used for wire bonding. As illustrated in FIG. 2, a plurality of bonding wires 11 are disposed to straddle the component 3a. When viewed in a direction perpendicular to the upper surface 20a of the multilayer wiring board 2, the bonding wires 11 are disposed in a grid form in a vertical direction and a lateral direction with respect to the component 3a. By disposing each bonding wire 11 to extend over the component 3a, a shield member 13 for the component 3a is formed. Also, according to this embodiment, the first protruding electrode 5a is disposed at an end portion that is a bonding ending-point portion 12b (an end portion on a second bond side). It is more difficult to control the loop shape of the bonding wire 11 as the height of the bonding wire 11 from the bonding ending-point portion 12b increases. In particular, the binding wire 11 may be bent on the second bond side by a permissible amount or more, possibly leading to a contact with the component 3a. However, in the present embodiment, the first protruding electrode 5a is disposed at the bonding ending-point portion 12b, and hence the height of the bonding wire 11 from the bonding ending-point portion 12b decreases. Accordingly, the loop shape can be stable. Thus, the bonding wire 11 can be disposed so as not to come into contact with the component 3a, at a position at a small distance from the component 3a.

The shield film 6 covers surfaces (the upper surface 4a and the side surfaces 4c) of the sealing resin layer 4 and side surfaces 20c of the multilayer wiring board 2. The shield film 6 is connected to a ground electrode (not illustrated) that is exposed from the side surfaces 20c of the multilayer wiring board 2.

The shield film 6 can be formed of a multilayer structure including a close contact film stacked on the upper surface 4a of the sealing resin layer 4, a conductive film stacked on the close contact film, and a protection film stacked on the conductive film. The close contact film is provided to increase the strength of close contact between the conductive film and the sealing resin layer 4. For example, the close contact film can be formed of a metal, such as steel use stainless (SUS). The conductive film is a layer that provides a substantial shield function of the shield film 6. The conductive film can be formed of, for example, one of copper, silver, and aluminum. The protection film is provided to prevent the conductive film from being corroded or damaged. The protection film can be formed of, for example, SUS.

According to the above-described embodiment, since the first protruding electrode 5a is disposed at the bonding ending-point portion 12b that is the end portion on the second bond side of the bonding wire 11, the height of the loop of the bonding wire 11 on the second bond side can be decreased, and the loop shape can be controlled. Thus, a contact of the bonding wire 11 with the component 3a because of undesired bending of the bonding wire 11 on the second bond side can be prevented from occurring. The shield member 13 straddling the component 3a can be easily formed while the distance between the side surface of the component 3a and the bonding wire 11 can be decreased. Moreover, since the distance between the component 3a and the bonding wire 11 can be decreased, components can be mounted with high density on the upper surface 20a of the multilayer wiring board 2. The degree of freedom in design can be increased.

Furthermore, a shield that covers the top surface of the component 3a can be easily formed as compared to a case where a shield is formed of only metal pins. Furthermore, when there is a component to be mounted by wire bonding on the upper surface 20a of the multilayer wiring board 2, a shield member using the bonding wire 11 can be formed simultaneously in a step of mounting the component, thereby decreasing the manufacturing cost.

Second Embodiment

Figure 3:
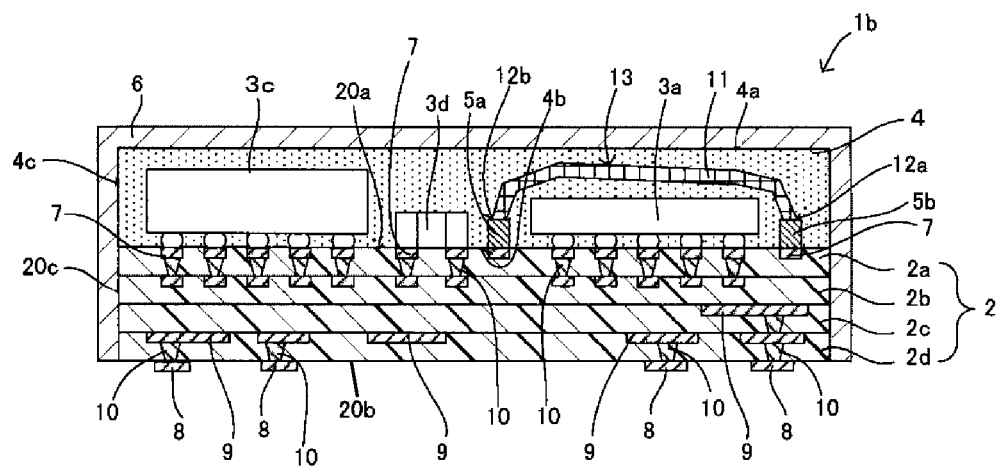
FIG. 3 is a cross-sectional view of a radio frequency module according to a second embodiment of the present disclosure.
Figure 4:
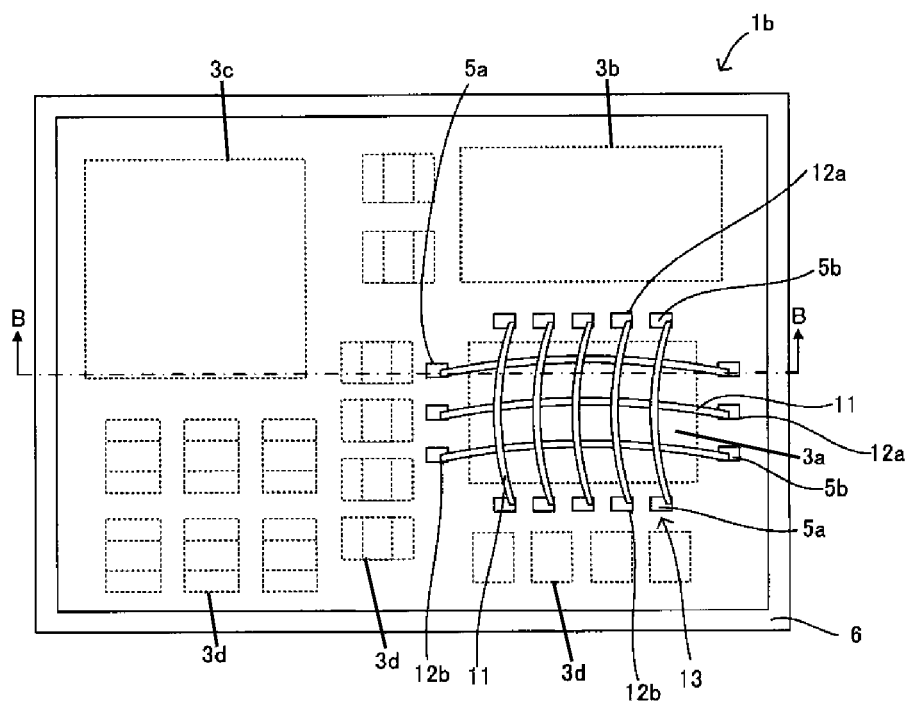
FIG. 4 is a plan view of the radio frequency module in FIG. 3 in a state without a shield film.

A radio frequency module 1b according to a second embodiment of the present disclosure is described with reference to FIGS. 3 and 4. FIG. 3 is a cross-sectional view of the radio frequency module 1b and is a cross-sectional view taken along line B-B in FIG. 4. FIG. 4 is a plan view of the radio frequency module 1b in a state without necessarily the shield film 6.

The radio frequency module 1b according to this embodiment differs from the radio frequency module 1a according to the first embodiment described with reference to FIGS. 1 and 2 in that, as illustrated in FIGS. 3 and 4, each of a plurality of second protruding electrodes 5b is disposed at a bonding starting-point portion 12a (an end portion on a first bond side) of the bonding wire 11. The other configuration is similar to that of the radio frequency module 1a of the first embodiment. The same reference sign is applied to the same component and the redundant description is omitted.

In this embodiment, each second protruding electrode 5b is disposed at the bonding starting-point portion 12a (the end portion on the first bond side) of the bonding wire 11, and each first protruding electrode 5a is disposed at the bonding ending-point portion 12b (the end portion on the second bond side) of the bonding wire 11. The second protruding electrode 5b can be formed similarly to the first protruding electrode 5a.

With this configuration, in addition to advantageous effects similar to those of the radio frequency module 1a according to the first embodiment, the height of the bonding wire 11 from the starting-point portion 12a and the height thereof from the ending-point portion 12b can be decreased. The loop shape can be further easily controlled.

Modification of Protruding Electrode

Figure 5:
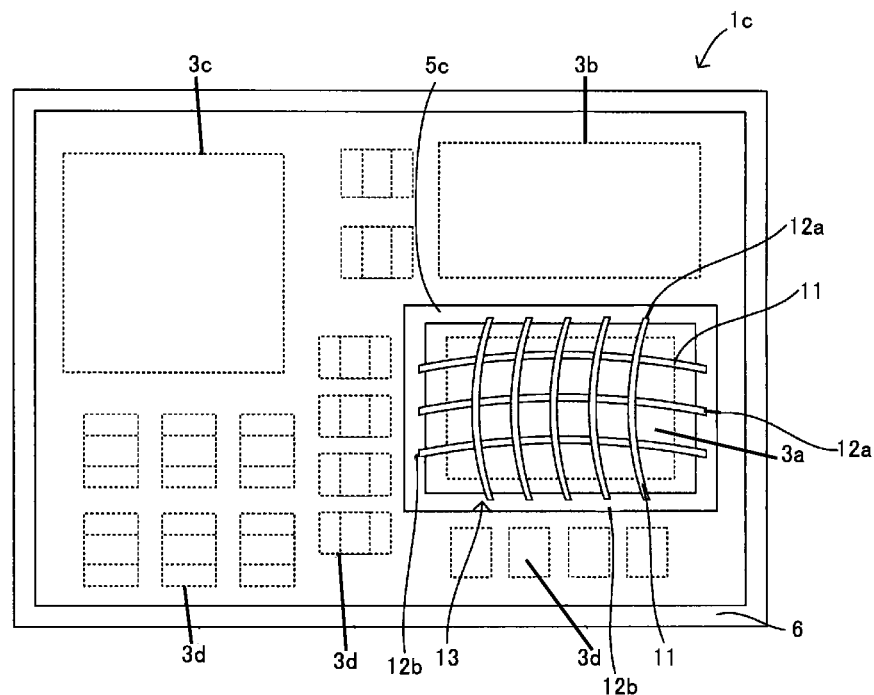
FIG. 5 is a view illustrating a modification of a protruding electrode of the radio frequency module in FIG. 3.

In the above-described embodiment, the plurality of first protruding electrodes 5a and the plurality of second protruding electrodes 5b are disposed on the upper surface 20a of the multilayer wiring board 2. However, a protruding electrode may be formed in a frame shape like a protruding electrode 5c of a radio frequency module 1c illustrated in FIG. 5. In this case, it is not required to form a plurality of protruding electrodes, thereby decreasing the manufacturing cost.

Modification of Bonding Wire

Figure 6:
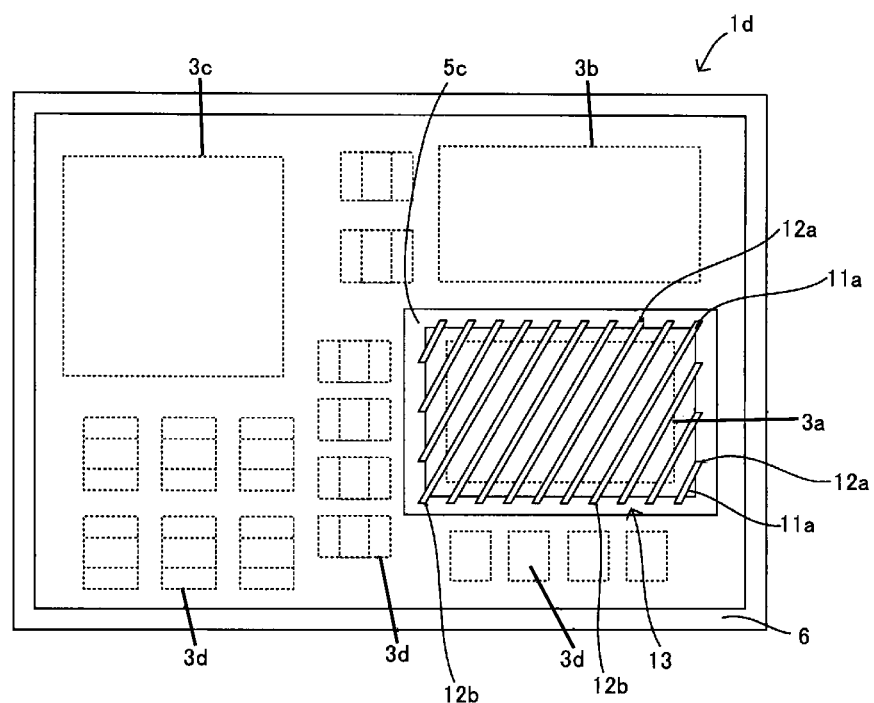
FIG. 6 is a view illustrating a modification of bonding wires of the radio frequency module in FIG. 3.

In the above-described embodiments, the plurality of bonding wires 11 are disposed in a grip form in the vertical direction and the lateral direction with respect to the component 3a when viewed in the direction perpendicular to the upper surface 20a of the multilayer wiring board 2. However, a plurality of bonding wires 11a may be arranged in substantially parallel to one another to extend in a direction oblique to the component 3a like a radio frequency module 1d illustrated in FIG. 6. The term substantially parallel means that an angle between the plurality of bonding wires 11a may be 0 degree or more or 5 degree or less. Since the bonding wires 11a are disposed in the direction oblique to the component 3a, the component 3a can be shielded from electromagnetic waves in the vertical direction and the lateral direction simultaneously. Accordingly, the shield characteristics for the component 3a can be increased using the less bonding wires 11a than the bonding wires disposed in a grid form.

Third Embodiment

Figure 7:
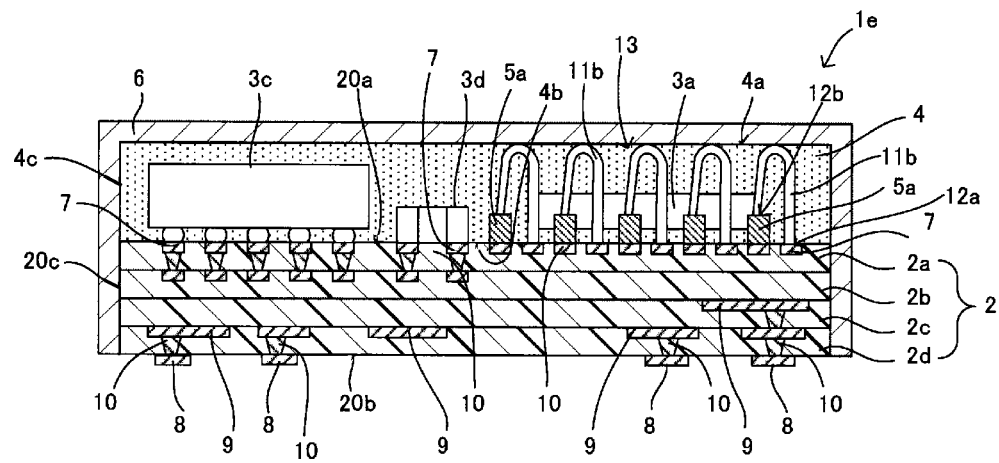
FIG. 7 is a cross-sectional view of a radio frequency module according to a third embodiment of the present disclosure.
Figure 8:
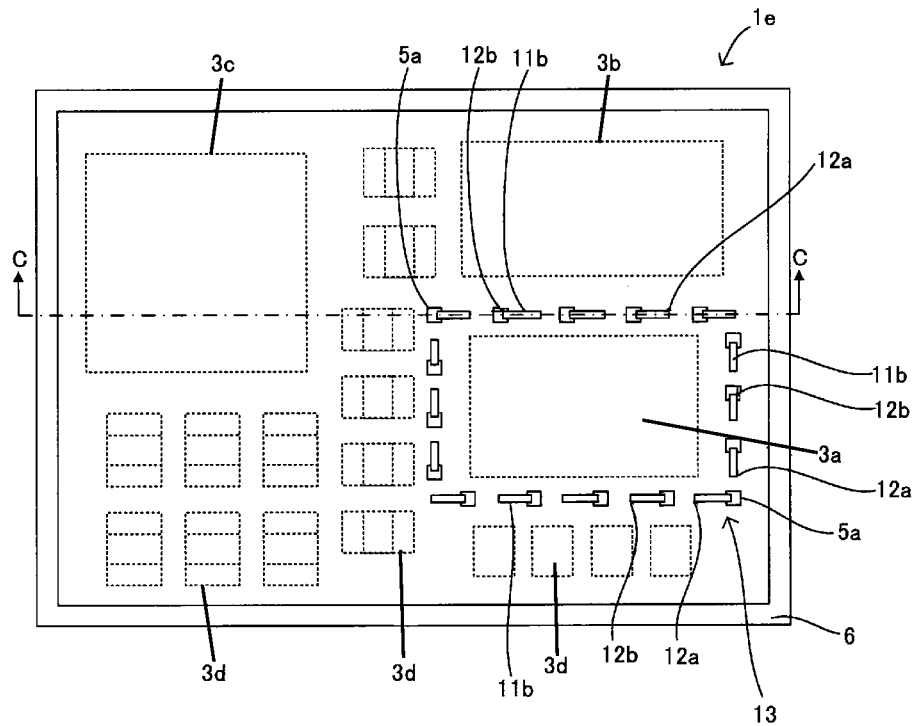
FIG. 8 is a plan view of the radio frequency module in FIG. 7 in a state without a shield film.

A radio frequency module 1e according to a third embodiment of the present disclosure is described with reference to FIGS. 7 and 8. FIG. 7 is a cross-sectional view of the radio frequency module 1e and is a cross-sectional view taken along line C-C in FIG. 8. FIG. 8 is a plan view in a state without necessarily the shield film 6 in FIG. 7.

The radio frequency module 1e according to this embodiment differs from the radio frequency module 1a according to the first embodiment described with reference to FIGS. 1 and 2 in that, as illustrated in FIGS. 7 and 8, a plurality of bonding wires 11b are disposed along the periphery of the component 3a to surround the component 3a when viewed in the direction perpendicular to the upper surface 20a of the multilayer wiring board 2. The other configuration is similar to that of the radio frequency module 1a of the first embodiment. The same reference sign is applied to the same component and the redundant description is omitted.

In this embodiment, the plurality of bonding wires 11b having bonding ending-point portions 12b (end portions on the second bond side) connected to first protruding electrodes 5a and bonding starting-point portions 12a (end portions on the first bond side) connected to the upper surface 20a of the multilayer wiring board 2 are disposed along the periphery of the component 3a, thereby forming a shield member to surround the side surfaces of the component 3a. Moreover, the bonding wires 11b are in contact with the shield film 6 at the upper surface 4a of the shielding resin layer 4. Thus, a shield that covers the side surfaces and the upper surface of the component 3a is formed.

With this configuration, since the bonding wires 11 are densely disposed, the loop shapes of the bonding wires 11 can be stable. Moreover, since the bonding wires 11 are in contact with the shield film 6 at the upper surface 4a of the sealing resin layer 4, the side surfaces and the upper surface of the component 3a can be shielded from electromagnetic waves.

Fourth Embodiment

Figure 9:
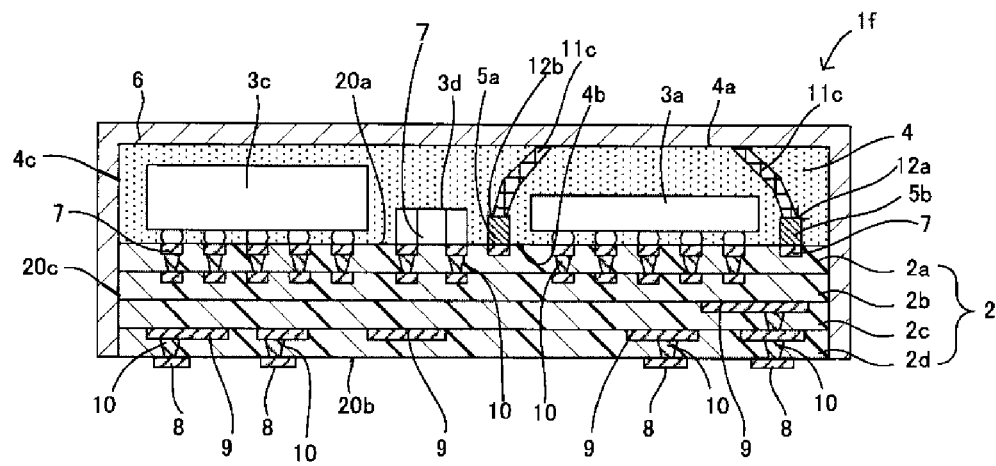
FIG. 9 is a cross-sectional view of a radio frequency module in a state without a shield film according to a fourth embodiment of the present disclosure.
Figure 10:
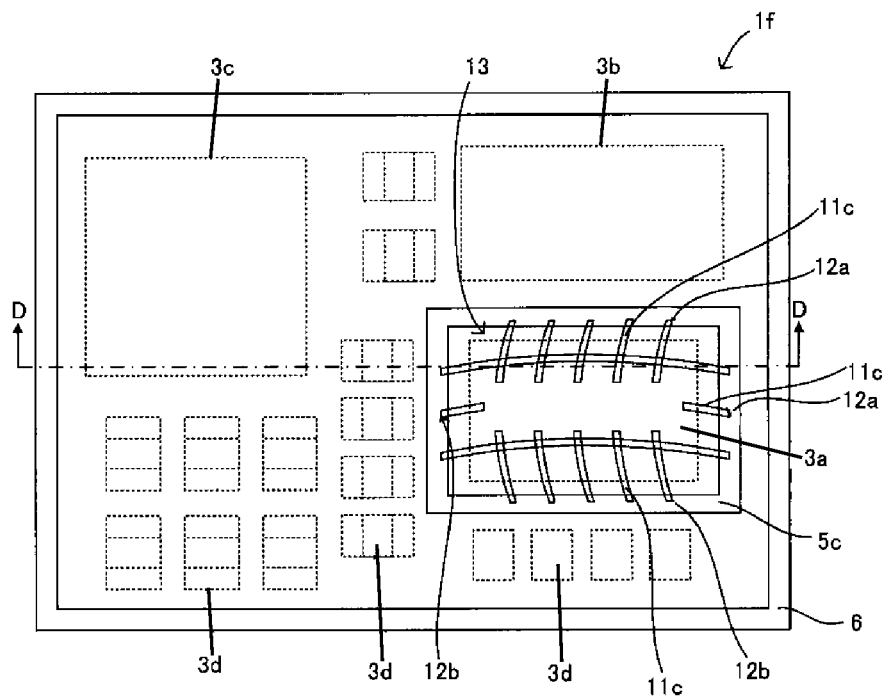
FIG. 10 is a plan view of the radio frequency module in FIG. 7 in a state without a shield film.
Figure 11:
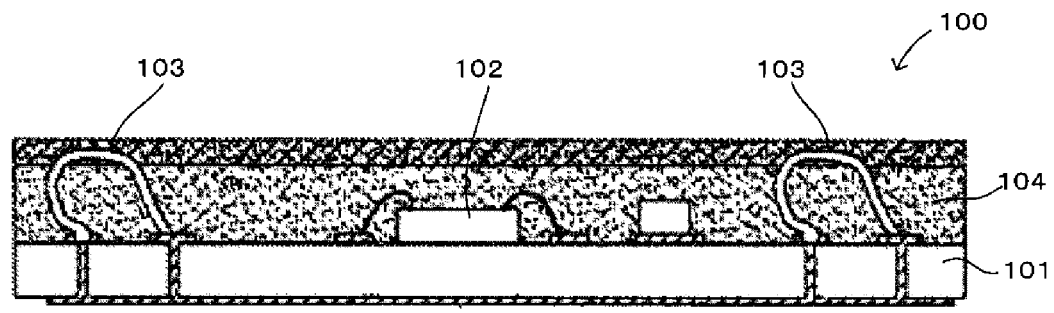
FIG. 11 is a cross-sectional view of a radio frequency module according to related art.

A radio frequency module 1f according to a fourth embodiment of the present disclosure is described with reference to FIGS. 9 and 10. FIG. 9 is a cross-sectional view of the radio frequency module 1f and is a cross-sectional view taken along line D-D in FIG. 10. FIG. 10 is a plan view in a state without necessarily the shield film 6 in FIG. 9.

The radio frequency module 1f according to this embodiment differs from the radio frequency module 1a according to the first embodiment described with reference to FIGS. 1 and 2 in that, as illustrated in FIGS. 9 and 10, bonding wires 11c are in contact with the shield film 6 at the upper surface 4a of the sealing resin layer 4. The other configuration is similar to that of the radio frequency module 1a of the first embodiment. The same reference sign is applied to the same component and the redundant description is omitted.

The sealing resin layer 4 is formed by disposing the bonding wires to straddle the component 3a, and then the upper surface 4a of the sealing resin layer 4 is ground, thereby exposing the bonding wires 11c from the upper surface 4a of the sealing resin layer 4. The shield film 6 is formed in this state. Thus, the bonding wires 11c connected to the shield film 6 at the upper surface 4a of the sealing resin layer 4 can be formed.

With this configuration, the bonding wires 11c and the shield film 6 can form a shield member 13 that covers the component 3a. Moreover, the height of the radio frequency module 1f can be decreased.

The present disclosure is not limited to the embodiments described above, and various modifications can be made in addition to the modifications described above within the scope of the disclosure. For example, the configurations of the above-described embodiments and modifications may be combined.

INDUSTRIAL APPLICABILITY

The present disclosure can be applied to various radio frequency modules each including a shield.

REFERENCE SIGNS LIST 1a to 1f radio frequency module
2 multilayer wiring board (wiring board)
3a to 3d component
4 sealing resin layer
5a to 5c protruding electrode (first protruding electrode, second protruding electrode)
6 shield film
11, 11a to 11c bonding wire
12a bonding starting-point portion
12b bonding ending-point portion
13 shield member

The invention claimed is:

1. A radio frequency module comprising:
a wiring board;
a component mounted on one principal surface of the wiring board via a mount, wherein the mount has a first height;
a first protruding electrode on the one principal surface of the wiring board, wherein the first protruding electrode has a second height greater than the first height; and
a shield member comprising a bonding wire, the shield member shielding the component,
wherein the bonding wire has a bonding starting-point portion connected to the one principal surface of the wiring board and a bonding ending-point portion connected to the first protruding electrode.

2. The radio frequency module according to claim 1, wherein the first protruding electrode comprises metal plating.

3. The radio frequency module according to claim 2, further comprising:
a second protruding electrode on the one principal surface of the wiring board,
wherein the starting-point portion is connected to the second protruding electrode.

4. The radio frequency module according to claim 2, further comprising:
a sealing resin layer that seals the component; and
a shield film on a surface of the sealing resin layer,
wherein the sealing resin layer has a contact surface that is in contact with the one principal surface of the wiring board, an opposite surface that is opposite to the contact surface, and side surfaces that connect end edges of the contact surface with end edges of the opposite surface,
wherein the shield film covers at least the opposite surface and the side surfaces of the sealing resin layer, and
wherein the bonding wire is in contact with the shield film at the opposite surface of the sealing resin layer.

5. The radio frequency module according to claim 1, wherein the first protruding electrode comprises a metal block.

6. The radio frequency module according to claim 5, further comprising:
a second protruding electrode on the one principal surface of the wiring board,
wherein the starting-point portion is connected to the second protruding electrode.

7. The radio frequency module according to claim 5, further comprising:
a sealing resin layer that seals the component; and
a shield film on a surface of the sealing resin layer,
wherein the sealing resin layer has a contact surface that is in contact with the one principal surface of the wiring board, an opposite surface that is opposite to the contact surface, and side surfaces that connect end edges of the contact surface with end edges of the opposite surface,
wherein the shield film covers at least the opposite surface and the side surfaces of the sealing resin layer, and
wherein the bonding wire is in contact with the shield film at the opposite surface of the sealing resin layer.

8. The radio frequency module according to claim 1, further comprising:
a second protruding electrode on the one principal surface of the wiring board,
wherein the starting-point portion is connected to the second protruding electrode.

9. The radio frequency module according to claim 8, wherein the second protruding electrode comprises metal plating.

10. The radio frequency module according to claim 9, further comprising:
a sealing resin layer that seals the component; and
a shield film on a surface of the sealing resin layer,
wherein the sealing resin layer has a contact surface that is in contact with the one principal surface of the wiring board, an opposite surface that is opposite to the contact surface, and side surfaces that connect end edges of the contact surface with end edges of the opposite surface,
wherein the shield film covers at least the opposite surface and the side surfaces of the sealing resin layer, and
wherein the bonding wire is in contact with the shield film at the opposite surface of the sealing resin layer.

11. The radio frequency module according to claim 8, wherein the second protruding electrode comprises a metal block.

12. The radio frequency module according to claim 11, further comprising:
a sealing resin layer that seals the component; and
a shield film on a surface of the sealing resin layer,
wherein the sealing resin layer has a contact surface that is in contact with the one principal surface of the wiring board, an opposite surface that is opposite to the contact surface, and side surfaces that connect end edges of the contact surface with end edges of the opposite surface,
wherein the shield film covers at least the opposite surface and the side surfaces of the sealing resin layer, and
wherein the bonding wire is in contact with the shield film at the opposite surface of the sealing resin layer.

13. The radio frequency module according to claim 8, further comprising:
a sealing resin layer that seals the component; and
a shield film on a surface of the sealing resin layer, wherein the sealing resin layer has a contact surface that is in contact with the one principal surface of the wiring board, an opposite surface that is opposite to the contact surface, and side surfaces that connect end edges of the contact surface with end edges of the opposite surface, wherein the shield film covers at least the opposite surface and the side surfaces of the sealing resin layer, and wherein the bonding wire is in contact with the shield film at the opposite surface of the sealing resin layer.

14. The radio frequency module according to claim 1, further comprising:

a sealing resin layer that seals the component; and a shield film on a surface of the sealing resin layer, wherein the sealing resin layer has a contact surface that is in contact with the one principal surface of the wiring board, an opposite surface that is opposite to the contact surface, and side surfaces that connect end edges of the contact surface with end edges of the opposite surface, wherein the shield film covers at least the opposite surface and the side surfaces of the sealing resin layer, and wherein the bonding wire is in contact with the shield film at the opposite surface of the sealing resin layer.

15. The radio frequency module according to claim 1, wherein the shield member comprises a plurality of the bonding wires, and wherein each of the plurality of bonding wires is disposed to straddle the component.

16. The radio frequency module according to claim 15, wherein some bonding wires of the plurality of bonding wires are disposed in substantially parallel to one another when viewed in a direction perpendicular to the one principal surface of the wiring board, and wherein residual bonding wires of the plurality of bonding wires are disposed in substantially parallel to one another to intersect with the some bonding wires.

17. The radio frequency module according to claim 15, wherein the component has a rectangular shape when viewed in a direction perpendicular to the one principal surface of the wiring board, and wherein the plurality of bonding wires are disposed in substantially parallel to one another in a direction oblique to a side of the component.

18. The radio frequency module according to claim 1, wherein the shield member comprises a plurality of the bonding wires, and wherein the plurality of bonding wires are disposed to extend along a periphery of the component to surround the component.

19. The radio frequency module according to claim 1, wherein a lower surface of the component is spaced relative to the one principal surface of the wiring board by a gap, wherein the first height has a dimension that is greater than a dimension of the gap.

20. A radio frequency module comprising:

a wiring board;

a component mounted on one principal surface of the wiring board via a mount wherein the mount has a first height;

a plurality of first protruding electrodes on the one principal surface of the wiring board, wherein each of said plurality of first protruding electrodes has a second height greater than the first height;

a shield member comprising a plurality of bonding wires and shielding the component;

a sealing resin layer that seals the component; and a shield film on a surface of the sealing resin layer, wherein the sealing resin layer has a contact surface that is in contact with the one principal surface of the wiring board, an opposite surface that is opposite to the contact surface, and side surfaces that couple end edges of the contact surface with end edges of the opposite surface, wherein the shield film covers at least the opposite surface and the side surfaces of the sealing resin layer, and wherein each of the bonding wires has one end that is connected to the first protruding electrode and another end that is exposed from the opposite surface of the sealing resin layer and that is connected to the shield film.

* * * * *